(12) United States Patent
Nam et al.

(10) Patent No.: US 9,575,356 B2
(45) Date of Patent: Feb. 21, 2017

(54) POLARIZER, DISPLAY SUBSTRATE, DISPLAY PANEL HAVING THE SAME AND METHOD OF MANUFACTURING THE SAME

(71) Applicant: Samsung Display Co., Ltd., Yongin (KR)

(72) Inventors: Jung-Gun Nam, Suwon-si (KR); Gug-Rae Jo, Asan-si (KR); Moon-Jung An, Hwaseong-si (KR); Dae-Young Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/753,644

(22) Filed: Jun. 29, 2015

(65) Prior Publication Data
US 2016/0170261 A1    Jun. 16, 2016

(30) Foreign Application Priority Data
Dec. 12, 2014 (KR) .......................... 10-2014-0179687

(51) Int. Cl.
| | | |
|---|---|---|
| G02F 1/1335 | (2006.01) | |
| G02F 1/1339 | (2006.01) | |
| G02B 27/28 | (2006.01) | |
| H01L 27/12 | (2006.01) | |
| H01L 27/32 | (2006.01) | |
| G02B 5/30 | (2006.01) | |
| H01F 27/32 | (2006.01) | |
| H01L 51/52 | (2006.01) | |

(52) U.S. Cl.
CPC ....... *G02F 1/133528* (2013.01); *G02B 5/3058* (2013.01); *G02B 27/288* (2013.01); *G02F 1/13362* (2013.01); *G02F 1/13394* (2013.01); *G02F 1/133512* (2013.01); *G02F 1/133514* (2013.01); *G02F 1/133553* (2013.01); *H01L 27/1214* (2013.01); *H01L 27/3213* (2013.01); *H01F 27/322* (2013.01); *H01L 51/5281* (2013.01)

(58) Field of Classification Search
CPC ................... G02F 1/133528; G02F 1/133512; G02F 1/133553; G02F 1/13394; G02F 1/13362; G02B 27/288; H01L 27/1214; H01L 27/3213; H01L 27/322; H01L 51/5281
USPC ....... 349/62, 114; 313/504, 506; 257/72, 89, 257/98, E27.12, E31.127
See application file for complete search history.

(56) References Cited

U.S. PATENT DOCUMENTS

| | | |
|---|---|---|
| 6,288,840 B1 | 9/2001 | Perkins et al. |
| 7,965,357 B2 | 6/2011 | Van De Witte et al. |

(Continued)

FOREIGN PATENT DOCUMENTS

| | | |
|---|---|---|
| KR | 10-2011-0061899 | 6/2011 |
| KR | 10-2014-0013654 | 2/2014 |
| KR | 10-2014-0046604 | 4/2014 |

*Primary Examiner* — Dao H Nguyen
(74) *Attorney, Agent, or Firm* — H.C. Park & Associates, PLC

(57) ABSTRACT

A display panel includes a light blocking pattern and a polarizer. The light blocking pattern is disposed on a base substrate. A plurality of opening areas is defined based on the light blocking pattern. The polarizer includes a plurality of linear patterns spaced apart from each other. The plurality of opening areas includes a color area transmitting color light and a white area transmitting white light. The polarizer overlaps the color area and the white area.

9 Claims, 13 Drawing Sheets

(56) References Cited

U.S. PATENT DOCUMENTS

| | | | |
|---|---|---|---|
| 8,207,668 B2* | 6/2012 | Cok | H01L 27/3213 |
| | | | 313/506 |
| 2009/0091238 A1* | 4/2009 | Cok | H01L 51/5265 |
| | | | 313/498 |
| 2010/0103517 A1 | 4/2010 | Davis et al. | |
| 2012/0280259 A1* | 11/2012 | Hatta | H01L 27/3213 |
| | | | 257/89 |
| 2012/0319222 A1* | 12/2012 | Ozawa | H01L 27/14605 |
| | | | 257/432 |
| 2014/0293187 A1* | 10/2014 | Nam | G02F 1/13362 |
| | | | 349/62 |

* cited by examiner form: POLARIZER, DISPLAY SUBSTRATE, DISPLAY PANEL HAVING THE SAME AND METHOD OF MANUFACTURING THE SAME

CROSS-REFERENCE TO RELATED APPLICATION

This application claims priority from and the benefit of Korean Patent Application No. 10-2014-0179687, filed on Dec. 12, 2014, which is hereby incorporated by reference for all purposes as if fully set forth herein.

BACKGROUND

Field

Exemplary embodiments relate to a polarizer, a display substrate and a display panel including the polarizer, and more particularly to a polarizer used to a display apparatus, a display substrate including the polarizer, a display panel including the polarizer and a method of manufacturing the polarizer.

Discussion of the Background

A liquid crystal display apparatus applies voltage to a liquid crystal layer to change arrangement of the liquid crystal layer. Accordingly, optical phenomenon such as birefringence, optical rotation, dichroism, light scattering or the like cause an optical change in the liquid crystal layer, thereby resulting in the display of an image on the display apparatus.

Generally, the liquid crystal display apparatus includes a display panel, a backlight assembly and a receiving container. The display panel includes a first substrate and a second substrate, and the backlight assembly includes a light source. Thus, the display panel displays an image by transmitting the light from the light source.

Recently, a transparent display apparatus using external light, such as natural light or fluorescent light, without the light source has been developed. The transparent display apparatus includes a polarizer to control light transmittance. The polarizer may transmit a polarization component parallel to a transmitting axis, and may block a polarization component perpendicular to the transmitting axis. The polarizer may absorb some of light, and thus, light efficiency of the liquid crystal display apparatus may undesirably decrease.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a polarizer capable of improving light efficiency.

Exemplary embodiments provide a display panel including the polarizer.

Exemplary embodiments provide a method of manufacturing the polarizer.

Additional aspects will be set forth in the detailed description which follows, and, in part, will be apparent from the disclosure, or may be learned by practice of the inventive concept.

An exemplary embodiment discloses a display panel including a light blocking pattern disposed on a substrate with open areas being defined based on the light blocking pattern, and a polarizer comprised of linear patterns spaced apart from each other, where opening areas comprise a color area that may transmit color light and a white area that may transmit white light and where the polarizer may overlap the color area and the white area.

An exemplary embodiment also discloses a display panel including a first display substrate comprising a light blocking pattern disposed on a first base substrate and a plurality of opening areas being defined based on the light blocking pattern, a first polarizer comprising a plurality of first linear patterns spaced apart from each other, a second display substrate opposite to the first display substrate, the second display substrate comprising a switching device disposed on a second base substrate, and a second polarizer comprising a plurality of second linear patterns spaced apart from each other and overlapping the first polarizer, where the plurality of opening areas comprise a color area transmitting color light and a white area transmitting white light and the first polarizer and the second polarizer overlap the color area and the white area.

An exemplary embodiment further discloses a method of manufacturing a polarizer, wherein a metal layer is formed on a substrate, a hard mask is formed on the metal layer, a polymer layer is formed using a printing device which deposits different amounts of liquid droplets according to different locations on the hard mask, a protrusion of the polymer layer is formed by applying pressure on the polymer layer based on a mold, a polymer pattern having different thicknesses is formed according to the locations on the hard mask, and the hard mask and the metal layer are patterned by using a remaining portion of the polymer pattern as a mask.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
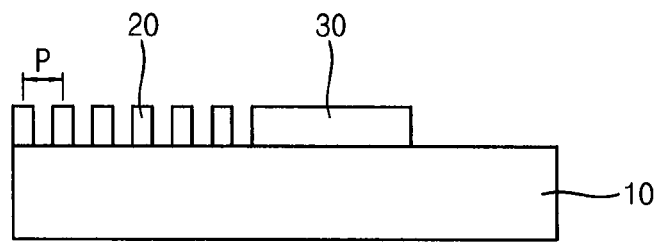
FIG. 1 is a cross-sectional view illustrating a polarizer in accordance with an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Referring to FIG. 1, the polarizer includes substrate 10, a plurality of linear patterns 20, and reflection pattern 30. Reflection pattern 30 and linear patterns 20 are disposed on a same layer.

Substrate 10 includes material which has relatively high transmittance, thermal stability, and chemical compatibility. In exemplary embodiments, substrate 10 may include at least one material selected from the group consisting of glass, polyethylenenaphthalate, polyethylene terephthalate, and polyacryl.

Linear patterns 20 may include at least one material selected from the group consisting of aluminum (Al), gold (Au), silver (Ag), copper (Cu), chrome (Cr), iron (Fe), and nickel (Ni).

Each of the linear patterns 20 may have a line width. Two adjacent linear patterns may be spaced apart from each other by a separation distance. Pitch P is a sum of the line width and the separation distance. The polarizer may include air gaps between adjacent linear patterns 20. In one or more exemplary embodiments, pitch P may be about 50 nm to about 150 nm.

The linear patterns 20 are formed in a portion on which light is transmitted. Reflection pattern 30 is formed in a portion on which light is not transmitted.

Reflection pattern 30 and linear patterns 20 are disposed on the same layer. Reflection pattern 30 may be comprised of at least one metal selected from the group consisting of aluminum (Al), gold (Au), silver (Ag), copper (Cu), chrome (Cr), iron (Fe), and nickel (Ni).

Figure 2:
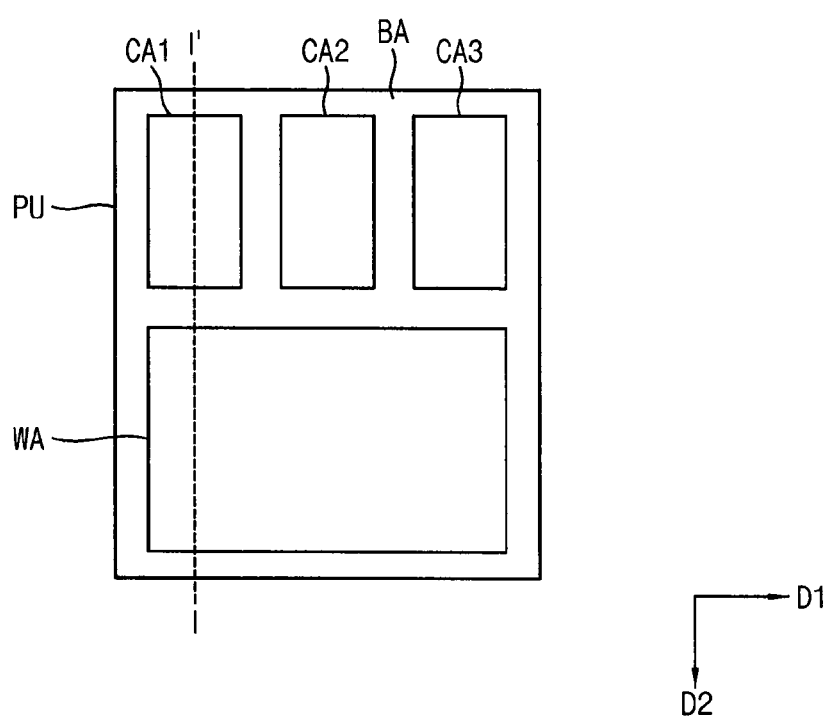
FIG. 2 is a plan view illustrating a pixel of a display panel in accordance with an exemplary embodiment.
Figure 3:
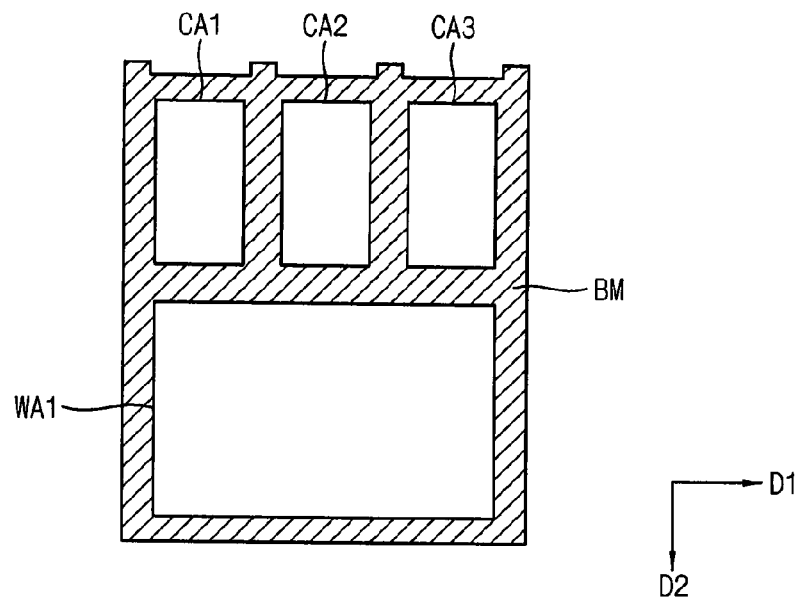
FIG. 3 is a plan view illustrating a light blocking pattern capable of applying the pixel of the display panel of FIG. 2.

Referring to FIGS. 2 and 3, the display panel includes a plurality of pixel units PU. The pixel units PU are arranged in a first direction D1 and a second direction D2 crossing (e.g., substantially perpendicular to) the first direction D1.

Pixel unit PU includes light blocking area BA and an opening area. The opening area includes a color area transmitting a color light and white area WA transmitting white light.

In exemplary embodiments, the color area may include a first color area CA1 transmitting red color light, second color area CA2 transmitting green color light, and third color area CA3 transmitting blue color light.

Referring to FIG. 3, the display panel includes light blocking pattern BM (e.g., a black matrix). Light blocking pattern BM corresponds to light blocking area BA. The boundary between color areas CA1, CA2, CA3, and white area WA is defined by light blocking pattern BM. In exemplary embodiments, light blocking pattern BM may overlap gate lines, data lines and switching devices. Light blocking pattern BM may include a dark color or black material such as inorganic black material, organic black material, etc. The black material may include a coloring agent, such as carbon black, organic material or inorganic material, color pigment, or the like to represent black. Light blocking pattern BM may include organic black material such as acryl resin or binder resin.

A portion of color filter CF disposed on color areas CA1, CA2, and CA3 overlaps light blocking pattern BM. White area WA may extend in first direction D1.

Figure 4:
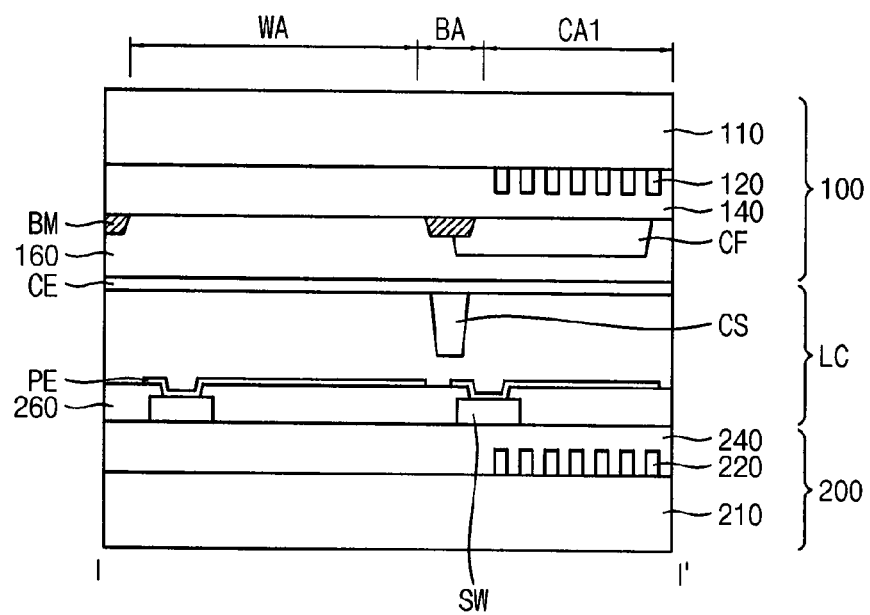
FIG. 4 is a cross-sectional view taken along a line I-I' of FIG. 2.

Referring to FIG. 4, the display panel includes first substrate 100, second substrate 200 opposite to first substrate 100, and a liquid crystal layer LC between first substrate 100 and second substrate 200.

First substrate 100 may include a color filter substrate including color filter patterns transmitting a color light from light of a backlight unit.

Second substrate 200 is opposite to first substrate 100. The liquid crystal layer LC is disposed between first substrate 100 and second substrate 200. Second substrate 200 may include a thin film transistor substrate including a thin film transistor. Second substrate 200 may also include a plurality of gate lines and a plurality of data lines.

Second substrate 200 includes second base substrate 210, switching device SW, a second polarizer, insulation layer 240, protecting layer 260 and pixel electrode PE.

Second base substrate 210 includes material which has a relatively high optical transmittance, thermal stability, and chemical compatibility. In exemplary embodiments, second base substrate 210 may include at least one material selected from the group consisting of glass, polyethylenenaphthalate, polyethylene terephthalate, and polyacryl.

The second polarizer is disposed on second base substrate 210. The second polarizer includes a plurality of linear patterns 220 spaced apart from each other. Linear patterns 220 may include at least one material selected from the group consisting of aluminum (Al), gold (Au), silver (Ag), copper (Cu), chrome (Cr), iron (Fe), and nickel (Ni).

Linear patterns 220 of the second polarizer overlap first color area CA1. Although not illustrated in FIG. 4, each of second color area CA2 and third color area CA3 may have a cross-sectional structure which is substantially the same as that of first color area CA1. In exemplary embodiments, linear patterns 220 of the second polarizer may overlap second color area CA2 and third color area CA3. Linear patterns 220 may not overlap light blocking area BA and white area WA.

Insulation layer 240 covers the second polarizer and may include a silicon oxide (SiOx).

Pixel electrode PE overlaps first color area CA1, which overlaps color filter CF. Switching device SW includes a gate electrode, a source electrode, and a drain electrode. Pixel electrode PE is electrically connected to the drain electrode of the switching device.

Protecting layer 260 is disposed on switching device SW and insulation layer 240. Protecting layer 260 may include inorganic material such as a silicon oxide (SiOx) and a silicon nitride (SiNx). In one or more exemplary embodiments, protecting layer 260 may include organic insulating material having relatively low permittivity, and may have a single layer or a double layer structure of inorganic and organic insulating layers.

Pixel electrode PE may be disposed on protecting layer 260. Pixel electrode PE is connected to the drain electrode through a contact hole. Pixel electrode PE may have a slit pattern including a plurality of openings, and may include a transparent conductive material, such as indium tin oxide ("ITO"), indium zinc oxide ("IZO"), and the like.

First substrate 100 includes first base substrate 110, a first polarizer, insulation layer 140, light blocking pattern BM, color filter CF, over-coating layer 160, and common electrode CE.

First base substrate 110 includes a material which has relatively high optical transmittance, thermal stability, and chemical compatibility. In exemplary embodiments, first base substrate 110 may include at least one material selected from the group consisting of glass, polyethylenenaphthalate, polyethylene terephthalate, and polyacryl.

The first polarizer is disposed on first base substrate 110. The first polarizer includes a plurality of linear patterns 120 spaced apart from each other. The linear patterns 120 may include at least one material selected from the group consisting of aluminum (Al), gold (Au), silver (Ag), copper (Cu), chrome (Cr), iron (Fe), and nickel (Ni).

The linear patterns 120 of the first polarizer overlap the first color area CA1. Although not illustrated in FIG. 4, each of second color area CA2 and third color area CA3 may have a cross-sectional structure which is substantially the same as that of first color area CA1. Thus, the linear patterns 120 of the second polarizer may overlap second color area CA2 and third color area CA3. The linear patterns 120 may not overlap light blocking area BA and white area WA.

Insulation layer 140 covers the first polarizer. Insulation layer 140 may include a silicon oxide (SiOx).

Color filter CF is disposed on light blocking pattern BM and insulation layer 140. Color filter CF filters the light passing through liquid crystal layer LC. Color filter CF may include a red color filter, green color filter and blue color filter. Color filter CF corresponds to a pixel area. The display panel may include a plurality of color filters. Color filters adjacent to each other may have different colors from each other. In exemplary embodiments, color filter CF may overlap an adjacent color filter in a boundary of the pixel area. In another exemplary embodiment, color filter CF may be spaced apart from an adjacent color filter in the boundary of the pixel area.

The over-coating layer 160 is disposed on light blocking pattern BM. The over-coating layer 160 provides a substantially planar surface and flattens the stepped profile of color filter CF, protects color filter CF, and insulates color filter CF. Over-coating layer 160 may include acrylic-epoxy material.

Common electrode CE corresponds to the pixel area. Common electrode CE is electrically connected to a common voltage line (not shown). Common electrode CE may have a slit pattern including a plurality of openings. Common electrode CE may include a transparent conductive material, such as indium tin oxide ("ITO"), indium zinc oxide ("IZO"), and other similar materials.

First substrate 100 may include column spacer CS. Column spacer CS maintains a gap between first substrate 100 and second substrate 200. Column spacer CS is disposed on light blocking pattern BM of the first substrate. In exemplary embodiments, column spacer CS may be disposed on second substrate 200.

Liquid crystal layer LC is disposed between first substrate 100 and second substrate 200. The liquid crystal layer LC includes liquid crystal molecules having optical anisotropy. The liquid crystal molecules are driven by electric field generated by voltages applied to pixel electrode PE and common electrode CE such that an image is displayed by passing or blocking light through the liquid crystal layer LC.

Figure 5:
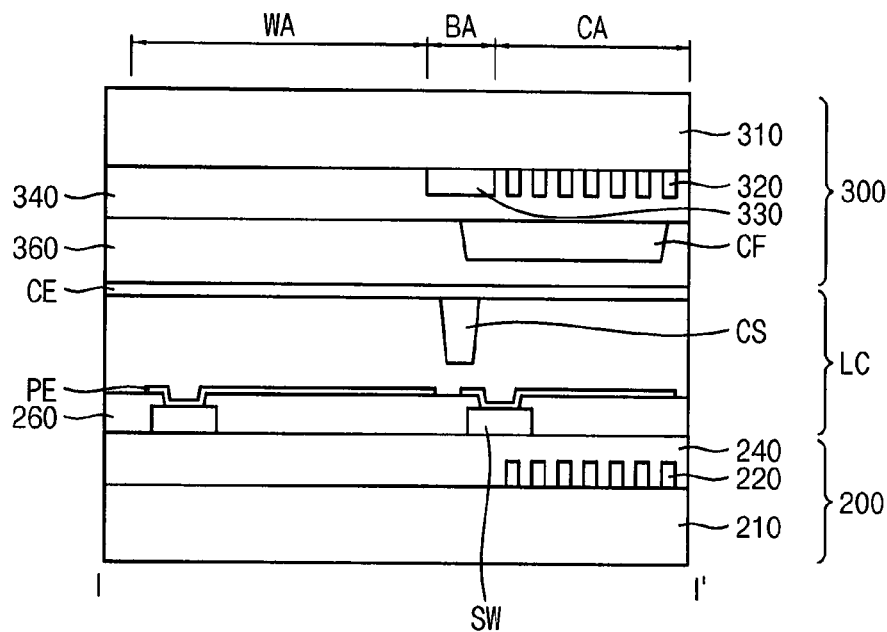
FIG. 5 is a cross-sectional view illustrating a display panel in accordance with an exemplary embodiment.

Referring to FIG. 5, the display panel includes first substrate 300, second substrate 200 and a liquid crystal layer LC. The elements in the display panel of FIG. 5 may be substantially the same as the elements in the display panel of FIG. 4, except for the first substrate 300. Thus, any further detailed descriptions concerning the same elements will be omitted.

First substrate 300 includes third base substrate 310, the third polarizer, insulation layer 340, color filter CF, over-coating layer 360, common electrode CE and column spacer CS.

The third base substrate 310 includes material which has relatively high optical transmittance, thermal stability, and chemical compatibility. In exemplary embodiments, third base substrate 310 may include at least one material selected from the group consisting of glass, polyethylenenaphthalate, polyethylene terephthalate, and polyacryl.

The third polarizer is disposed on third base substrate 310. The third polarizer includes a plurality of linear patterns 320 spaced apart from each other and reflection pattern 330. Reflection pattern 330 and linear patterns 320 are disposed on a same layer.

The plurality of the linear patterns 320 may include at least one material selected from the group consisting of aluminum (Al), gold (Au), silver (Ag), copper (Cu), chrome (Cr), iron (Fe), and nickel (Ni).

The linear patterns 320 of the third polarizer are disposed on color area CA of first substrate 300.

Reflection pattern 330 is disposed on light blocking area BA of first substrate 300.

Reflection pattern 330 may have a flat surface and may overlap switching device SW. Reflection pattern 330 and the linear patterns 320 are disposed on the same layer. Reflection pattern 330 may include same material as the linear patterns 320. In exemplary embodiments, reflection pattern 330 may include at least one material selected from the group consisting of aluminum (Al), gold (Au), silver (Ag), copper (Cu), chrome (Cr), iron (Fe), and nickel (Ni). Reflection pattern 330 may also include multi-layered structure.

The linear patterns 320 and reflection pattern 330 are not disposed on white area WA.

Insulation layer 340 covers the third polarizer. Insulation layer 340 may include a silicon oxide (SiOx).

Figure 6:
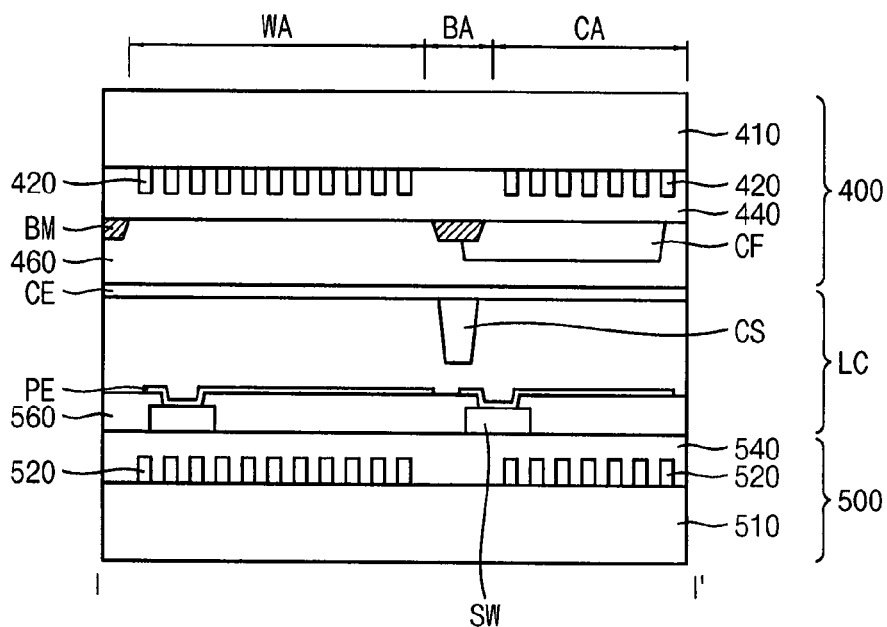
FIG. 6 is a cross-sectional view illustrating a display panel in accordance with an exemplary embodiment.

Referring to FIG. 6, the display panel includes first substrate 400, second substrate 500 and a liquid crystal layer LC. The elements in the display panel of FIG. 6 may be substantially the same as the elements in the display panel of FIG. 4, except for first and second substrates 400 and 500. Thus, any further detailed descriptions concerning the same elements will be omitted.

First substrate 400 includes fourth base substrate 410, the fourth polarizer, insulation layer 440, light blocking pattern BM, color filter CF, over-coating layer 460, common electrode CE, and column spacer CS.

The fourth base substrate 410 includes material which has relatively high optical transmittance, thermal stability, and chemical compatibility. In exemplary embodiments, the fourth base substrate 410 may include at least one material selected from the group consisting of glass, polyethylenenaphthalate, polyethylene terephthalate, and polyacryl.

The fourth polarizer is disposed on fourth base substrate 410. The fourth polarizer includes a plurality of linear patterns 420 spaced apart from each other.

The linear patterns 420 may include at least one material selected from the group consisting of aluminum (Al), gold (Au), silver (Ag), copper (Cu), chrome (Cr), iron (Fe), and nickel (Ni).

The linear patterns 420 of the fourth polarizer are disposed on color area CA and white area WA of first substrate 400. The linear patterns 420 are not disposed on light blocking area BA.

Insulation layer 440 covers the fourth polarizer, and may include a silicon oxide (SiOx).

Light blocking pattern BM is disposed on insulation layer 440. Light blocking pattern BM may include, in exemplary embodiments, a dark color or black material such as inorganic black material, organic black material, etc. In exemplary embodiments, the black material may include a coloring agent, such as carbon black, organic material or inorganic material, color pigment, or the like to represent black. Light blocking pattern BM may include organic black material such as acryl resin or binder resin.

Second substrate 500 includes fifth base substrate 510, the fifth polarizer, insulation layer 540, protecting layer 560, and pixel electrode PE.

Fifth base substrate 510 includes material which has relatively high optical transmittance, thermal stability, and chemical compatibility. In exemplary embodiments, fifth base substrate 510 may include at least one material selected from the group consisting of glass, polyethylenenaphthalate, polyethylene terephthalate, and polyacryl.

The fifth polarizer is disposed on fifth base substrate 510. The fifth polarizer includes a plurality of linear patterns 520. The linear patterns 520 may include at least one material selected from the group consisting of aluminum (Al), gold (Au), silver (Ag), copper (Cu), chrome (Cr), iron (Fe), and nickel (Ni).

The linear patterns 520 of the fifth polarizer are disposed on color area CA and white area WA of second substrate 500. The linear patterns 520 are not disposed on light blocking area BA of second substrate 500.

The linear patterns 420 of first substrate 400 may extend in first direction D1. The linear patterns 520 of second substrate 500 may extend in second direction D2 crossing (e.g., substantially perpendicular to or perpendicular to) the first direction D1.

In exemplary embodiments, a normally black state of the display panel has its minimum luminance blocked when voltage is not applied. When the linear patterns 420 of first substrate 400 are extended in the first direction, and the linear patterns 520 of second substrate 500 are extended in s second direction, which may be perpendicular or substantially perpendicular to the first direction, the linear patterns 420 and 520 disposed on white area WA of the display panel reflect light and serve as a mirror when the display panel is off. Linear patterns 420 and 520 disposed on white area WA of the display panel transmit light when the display panel is on, and serve as a transparent display device.

Insulation layer 540 covers the fifth polarizer, and may include a silicon oxide (SiOx).

Switching device SW and pixel electrode PE are disposed on color area CA, which overlaps color filter CF. The switching device SW includes a gate electrode, a source electrode and a drain electrode. The pixel electrode PE is electrically connected to the drain electrode of the switching device SW.

Protecting layer 560 is disposed on switching device SW and insulation layer 540. Protecting layer 560 may include inorganic material such as a silicon oxide (SiOx) and a silicon nitride (SiNx), but is not limited thereto or thereby. In one or more exemplary embodiments, protecting layer 560 may have a single layer or double layer structure of inorganic and organic insulating layers.

Pixel electrode PE is disposed on protecting layer 560. Pixel electrode PE may have a slit pattern including a plurality of openings. Pixel electrode PE may include a transparent conductive material, such as indium tin oxide ("ITO"), indium zinc oxide ("IZO"), and the like.

Figure 7:
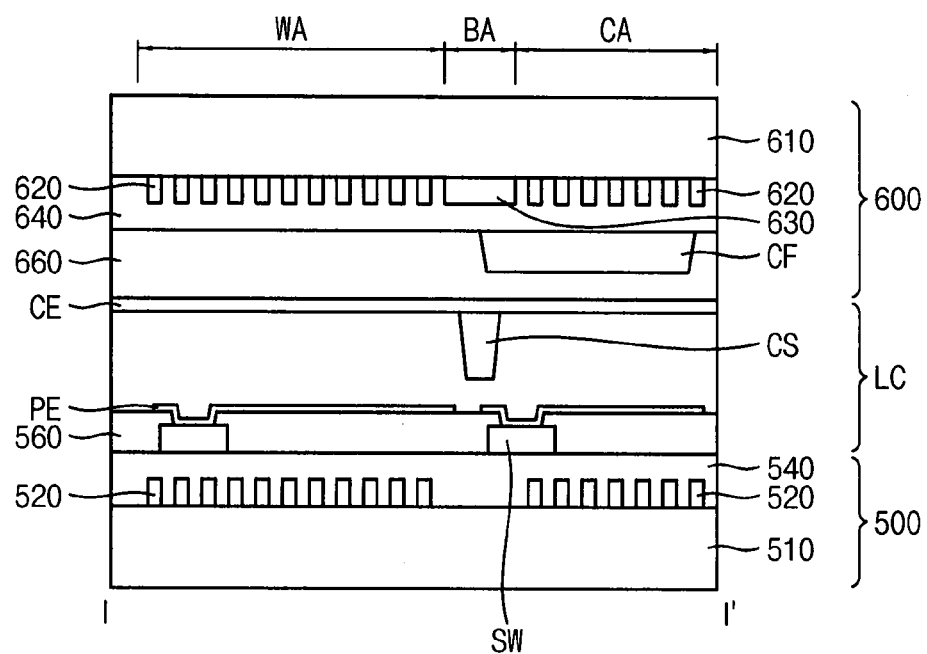
FIG. 7 is a cross-sectional view illustrating a display panel in accordance with an exemplary embodiment.

Referring to FIG. 7, the display panel includes first substrate 600, second substrate 500, and a liquid crystal layer LC. The elements in the display panel of FIG. 7 may be substantially the same as the elements in the display panel of FIG. 6, except for first substrates 600. Thus, any further detailed descriptions concerning the same elements will be omitted.

First substrate 600 includes sixth base substrate 610, the sixth polarizer, insulation layer 640, color filter CF, overcoating layer 660, common electrode CE, and column spacer CS.

Sixth base substrate 610 includes material which has relatively high optical transmittance, thermal stability, and chemical compatibility. In exemplary embodiments, sixth base substrate 610 may include at least one material selected from the group consisting of glass, polyethylenenaphthalate, polyethylene terephthalate, and polyacryl.

The sixth polarizer is disposed on sixth base substrate 610. The sixth polarizer includes a plurality of linear patterns 620 spaced from each other and reflection pattern 630. Reflection pattern 630 and the linear patterns 620 are disposed on the same layer.

The linear patterns 620 may include at least one material selected from the group consisting of aluminum (Al), gold (Au), silver (Ag), copper (Cu), chrome (Cr), iron (Fe), and nickel (Ni).

The linear patterns 620 of the sixth polarizer are disposed on color area CA and white area WA of first substrate 600.

Reflection pattern 630 is disposed on light blocking area BA of first substrate 600, and may have a flat surface overlapping switching device SW.

Reflection pattern 630 and the linear patterns 620 are disposed on the same layer. Reflection pattern 630 may include the same material as the linear patterns 620. In exemplary embodiments, reflection pattern 630 may include at least one material selected from the group consisting of aluminum (Al), gold (Au), silver (Ag), copper (Cu), chrome (Cr), iron (Fe), and nickel (Ni). The reflection pattern 630 may include multi-layered structure.

Insulation layer 640 covers the sixth polarizer, and may include a silicon oxide (SiOx).

Second substrate 500 includes fifth base substrate 510, the fifth polarizer, insulation layer 540, protecting layer 560, and pixel electrode PE.

Fifth base substrate 510 includes material which has relatively high optical transmittance, thermal stability, and chemical compatibility. In exemplary embodiments, fifth base substrate 510 may include at least one material selected from the group consisting of glass, polyethylenenaphthalate, polyethylene terephthalate, and polyacryl.

The fifth polarizer is disposed on fifth base substrate 510. The fifth polarizer includes a plurality of linear patterns 520. The linear patterns 520 may include at least one material selected from the group consisting of aluminum (Al), gold (Au), silver (Ag), copper (Cu), chrome (Cr), iron (Fe), and nickel (Ni).

The linear patterns 520 of the fifth polarizer are disposed on color area CA and white area WA of second substrate 500. The linear patterns 520 are not disposed on light blocking area BA of second substrate 500.

The linear patterns 620 of first substrate 600 may be extended in the first direction. The linear patterns 520 of second substrate 500 may be extended in a second direction perpendicular to the first direction.

In exemplary embodiments, a normally black state of the display panel has its luminance blocked when voltage is not applied. When the linear patterns 620 of first substrate 600 are extended in the first direction, and the linear patterns 520 of second substrate 500 are extended in the second direction, which may be substantially perpendicular or perpendicular to the first direction, the linear patterns 620 and 520 disposed on white area WA of the display panel reflect light and serve as a mirror when the display panel is turned off. The linear patterns 620 and 520 disposed on the white area WA of the display panel transmit light when the display panel is turned on, and serve as a transparent display device.

Insulation layer 540 covers the fifth polarizer, and may include a silicon oxide (SiOx).

Switching device SW and pixel electrode PE are disposed on color area CA, which overlaps the color filter CF. The switching device SW includes a gate electrode, a source electrode and a drain electrode. The pixel electrode PE is electrically connected to the drain electrode of the switching device SW.

Protecting layer 560 is disposed on switching device SW and insulation layer 540. Protecting layer 560 may include inorganic material such as a silicon oxide (SiOx) and a silicon nitride (SiNx), but is not limited thereto or thereby. In addition, protecting layer 560 may have a single layer or double layer structure of inorganic and organic insulating layers.

Pixel electrode PE is disposed on protecting layer 560. Pixel electrode PE may have a slit pattern including a plurality of openings. Pixel electrode PE may also include a transparent conductive material, such as indium tin oxide ("ITO"), indium zinc oxide ("IZO"), and the like.

Figure 8A:
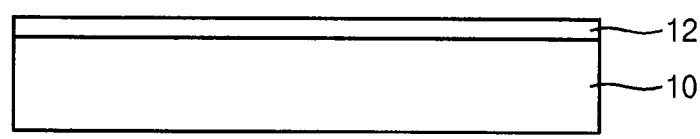
FIGS. 8A, 8B, 8C, 8D, 8E, 8F, 8G, and 8H are cross-sectional views for describing a method of manufacturing a polarizer in accordance with an exemplary embodiment.

Referring to FIG. 8A, metal layer 12 is formed on a substrate 10. Substrate 10 includes material which has relatively high optical transmittance, thermal stability, and chemical compatibility. In exemplary embodiments, substrate 10 may include at least one material selected from the group consisting of glass, polyethylenenaphthalate, polyethylene terephthalate, and polyacryl. Metal layer 12 may include at least one material selected from the group consisting of aluminum (Al), gold (Au), silver (Ag), copper (Cu), chrome (Cr), iron (Fe), and nickel (Ni). Metal layer 12 may be formed by a deposition process. In exemplary embodiments, the metal layer 12 may be formed by a chemical vapor deposition process.

Figure 8B:
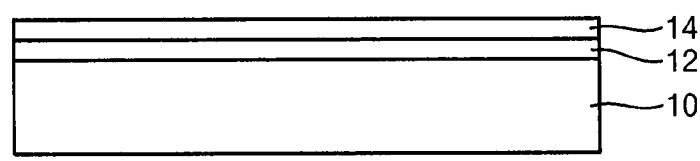

Referring to FIG. 8B, hard mask 14 is formed on metal layer 12. Hard mask 14 may include a silicon oxide (SiOx) or a silicon dioxide (SiO$_2$). The hard mask may be formed by a deposition process such as chemical vapor deposition.

Figure 8C:
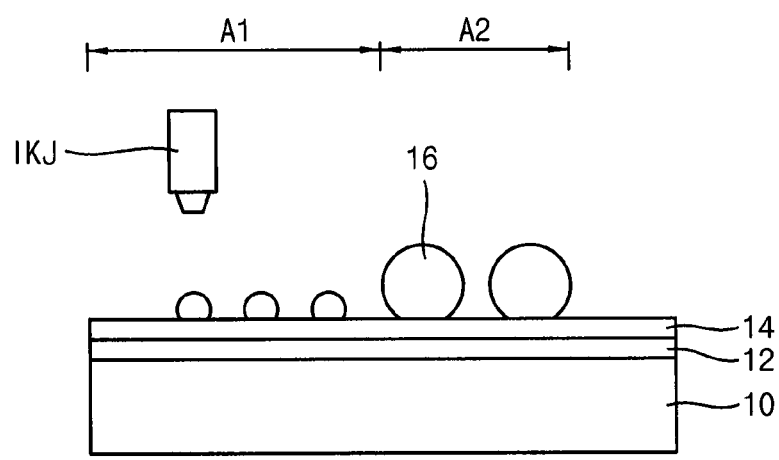

Referring to FIG. 8C, liquid droplets 16 may be provided from a printing devices such as an inkjet printing device IKJ.

The printing devices may deposit different amounts of liquid droplets 16 according to different locations on hard mask 14. In exemplary embodiments, the first amount of the liquid droplets may be provided from the inkjet printing device IKJ on first area A1. The second amount of the liquid droplets, which is greater than the first amount of the liquid droplets, may be provided from the inkjet printing device IKJ on second area A2, which is adjacent to the first area. Polymer layer 16a in FIGS. 8D and 8E is formed based on the liquid droplets 16.

An ink composition used to the printing devices for forming the liquid droplet 16 may include thermosetting resin or photo curable resin, but is not limited thereto or thereby. In exemplary embodiments, the thermosetting resin may include urea resin, melamine resin, phenol resin, etc. In addition, the photo curable resin may include polymerizable compounds having a polymerizable functional group, a photopolymerization initiator initiating polymerization of the polymerizable compounds by irradiation, surfactants, antioxidants, etc.

Figure 8D:
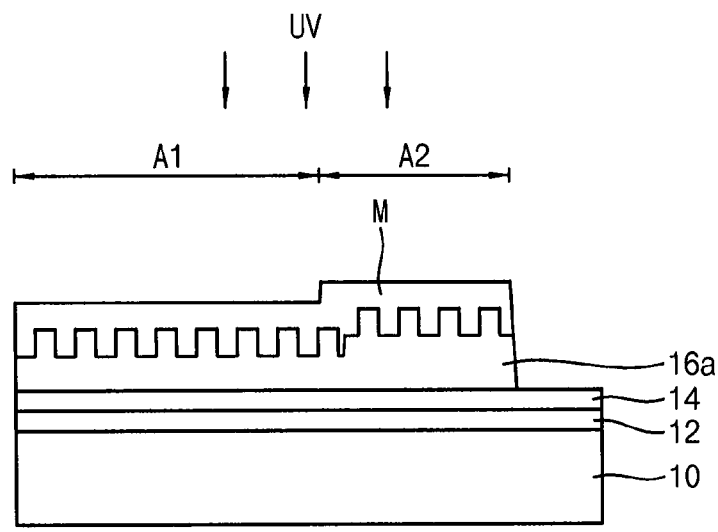
Figure 8E:
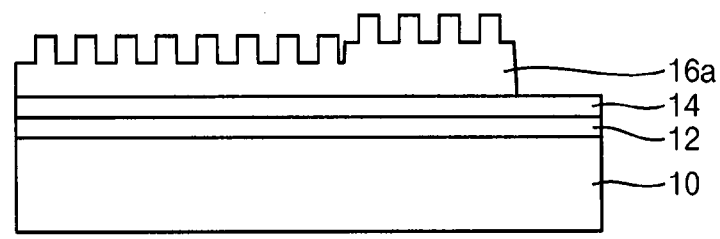

Referring to FIG. 8D, mold M is contacted with polymer layer 16a (e.g., the liquid droplets 16), and the mold is pressed toward substrate 10 as indicated by the downward arrows, and thus a protrusion is formed on an upper surface of polymer layer 16a. Mold M may include a flexible mold or a film mold. Mold M may have a protrusions and recesses. Polymer layer 16a may have recesses facing the protrusions of mold M and may have protrusions facing the recesses of mold M.

When polymer layer 16a includes thermosetting resin, mold M may include material which has a relatively low coefficient of thermal expansion, such as metal. When polymer layer 16a includes the photo curable resin, mold M may include material which has relatively high light-transmittance and strength, such as a transparent macromolecule.

When polymer layer 16a includes thermosetting resin, mold M is contacted with polymer layer 16a, and polymer layer 16a is heated to a temperature above the glass transition temperature of the thermosetting resin. Afterwards, mold M is pressed toward polymer layer 16a such that the pattern of mold M is imprinted on polymer layer 16a. Polymer layer 16a is then cooled to a temperature under the glass transition temperature such that patterned polymer layer 16a hardens.

When polymer layer 16a includes the photo curable resin, mold M is contacted with polymer layer 16a, and then mold M is pressed toward the polymer layer 16a such that the pattern of mold M is imprinted in polymer layer 16a. Mold M includes material which has high light-transmittance, such that polymer layer 16a may be irradiated by light. Patterned polymer layer 16a may harden after polymer layer 16a is light irradiated.

In the forming polymer layer 16a, the thickness of polymer layer 16a disposed in first area A1 may be smaller than the thickness of polymer layer 16a disposed in second area A2, which is adjacent to the first area A1, because of the different amounts of liquid droplets 16 used.

Referring to FIG. 8E, mold M is removed from patterned polymer layer 16a. Polymer layer 16a is formed on hard mask 14.

Figure 8F:
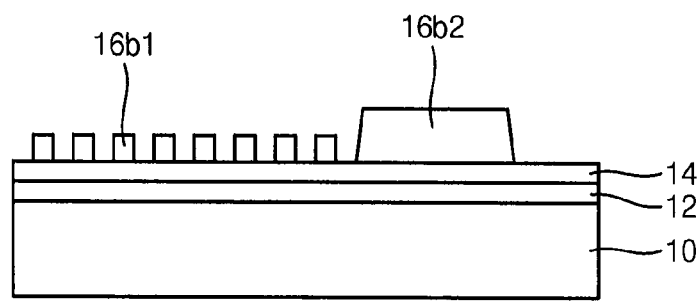

Referring to FIG. 8F, polymer layer 16a is then etched. The thickness of polymer layer 16a is entirely reduced by etching. Thus, the protrusions of polymer layer 16a disposed in the first area A1 remains and first polymer pattern 16b1 is formed. A portion of polymer layer 16a disposed in second area A2 also remains and second polymer pattern 16b2 is formed. In exemplary embodiments, second polymer pattern 16b2 may have a flat or concave surface. First polymer pattern 16b1 may include a plurality of linear pattern spaced apart from each other. An upper surface of hard mask 14 may be exposed between adjacent linear patterns.

Figure 8G:
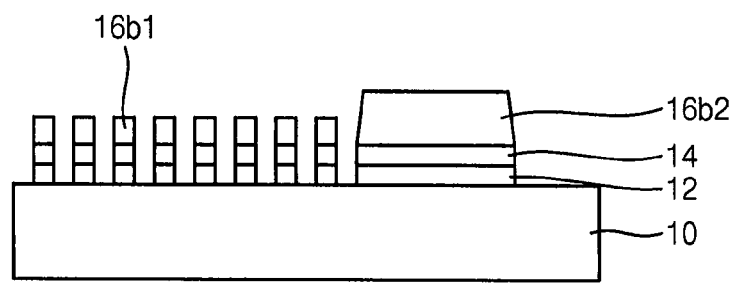

Referring to FIG. 8G, hard mask 14 and metal layer 12 are etched by using first polymer pattern 16a1 and second polymer pattern 16a2 as a cover mask. In exemplary embodiments, hard mask 14 and metal layer 12 may be dry-etched.

Figure 8H:
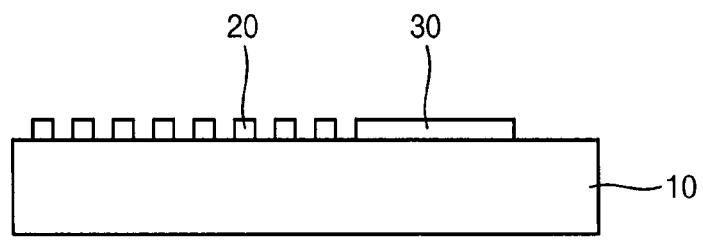

Referring to FIG. 8H, the remaining polymer layer and hard mask 14 are removed. A plurality of linear patterns 20 and reflection pattern 30 are formed from the remaining polymer layer. Alternatively, a portion of hard mask 14 may not be removed.

The size of the linear patterns 20 and reflection pattern 30 may be adjusted by controlling the thickness of metal layer 12 and width of mold M.

A polarizer includes substrate 10, the plurality of the linear patterns 20 and reflection pattern 30. Reflection pattern 30 and the linear patterns 20 are disposed on the same layer.

Substrate 10 includes material which has relatively high optical transmittance, thermal stability, and chemical compatibility. In exemplary embodiments, substrate 10 may include at least one material selected from the group consisting of glass, polyethylenenaphthalate, polyethylene terephthalate, and polyacryl.

The linear patterns 20 may include at least one material selected from the group consisting of aluminum (Al), gold (Au), silver (Ag), copper (Cu), chrome (Cr), iron (Fe), and nickel (Ni).

Each of the linear patterns 20 may have a line width. Two adjacent linear patterns may be spaced apart from each other by a separation distance. Pitch P is the sum of the line width and the separation distance. The polarizer may include an air gap between adjacent linear patterns 20. In exemplary embodiments, pitch P may be about 50 nm to about 150 nm.

The plurality of the linear patterns 20 is formed in a portion on which light is transmitted. Reflection pattern 30 is formed in a portion on which light is not transmitted.

Reflection pattern 30 and the linear patterns 20 are disposed on the same layer. Reflection pattern 30 may include at least one material selected from the group consisting of aluminum (Al), gold (Au), silver (Ag), copper (Cu), chrome (Cr), iron (Fe), and nickel (Ni).

Figure 9A:
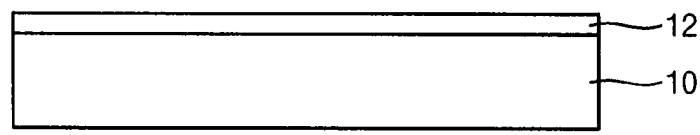
FIGS. 9A, 9B, 9C, 9D, 9E, 9F, 9G, 9H, 9I, and 9J are cross-sectional views for describing a method of manufacturing a polarizer in accordance with an exemplary embodiment.

Referring to FIG. 9A, a metal layer is formed on substrate 10. Substrate 10 includes material which has relatively high optical transmittance, thermal stability, and chemical compatibility. In exemplary embodiments, substrate 10 may include at least one material selected from the group consisting of glass, polyethylenenaphthalate, polyethylene terephthalate, and polyacryl. Metal layer 12 may include at least one material selected from the group consisting of aluminum (Al), gold (Au), silver (Ag), copper (Cu), chrome (Cr), iron (Fe), and nickel (Ni). Metal layer 12 may be formed by a deposition process such as chemical vapor deposition.

Figure 9B:
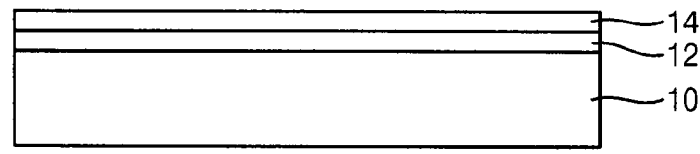

Referring to FIG. 9B, hard mask 14 is formed on metal layer 12. Hard mask 14 may include a silicon oxide (SiOx) or a silicon dioxide ($SiO_2$). The hard mask may be formed by a deposition process such as chemical vapor deposition.

Figure 9C:
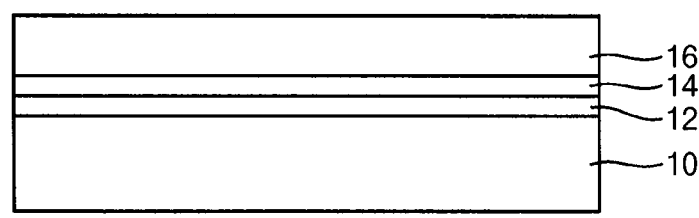

Referring to FIG. 9C, polymer layer 16 is formed on hard mask 14. Polymer layer 16 may include thermosetting resin or photo curable resin. In exemplary embodiments, the thermosetting resin may include urea resin, melamine resin, phenol resin, etc. In addition, the photo curable resin may include polymerizable compounds having a polymerizable functional group, a photopolymerization initiator initiating polymerization of the polymerizable compounds by irradiation, surfactants, antioxidants, etc.

Figure 9D:
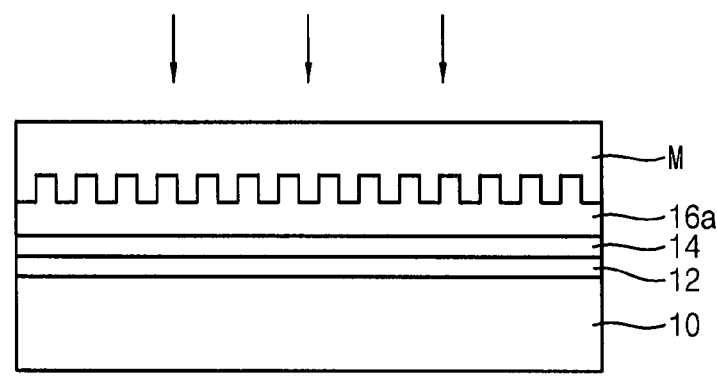

Referring to FIG. 9D, mold M is contacted with polymer layer 16a, and the mold is pressed toward substrate 10 as indicated by the downward arrows, and thus protrusion 16a is formed on an upper surface of polymer layer 16. Mold M may have protrusions and recesses. Polymer layer 16 may have recesses facing the protrusions of mold M and may have protrusions facing the recesses of mold M.

When polymer layer 16 includes thermosetting resin, mold M may include material, which has relatively low coefficient of thermal expansion, such as metal. When the polymer layer 16a includes the photo curable resin, mold M may include material which has relatively high light-transmittance and strength, such as a transparent macromolecule.

When polymer layer 16 includes thermosetting resin, mold M is contacted with polymer layer 16, and polymer layer 16 is heated to a temperature above the glass transition temperature of the thermosetting resin. Afterwards, mold M is pressed toward polymer layer 16 such that the pattern of mold M is imprinted on polymer layer 16. Polymer layer 16 is then cooled to a temperature under the glass transition temperature such that patterned polymer layer 16 is hardened.

When polymer layer 16 includes photo curable resin, mold M is contacted with polymer layer 16, and then mold M is pressed toward polymer layer 16a such that the pattern of mold M is imprinted on polymer layer 16. Mold M includes material which has high light-transmittance such that polymer layer 16 may be light irradiated. Patterned polymer layer 16 may harden after the polymer layer 16 is light irradiated.

Figure 9E:
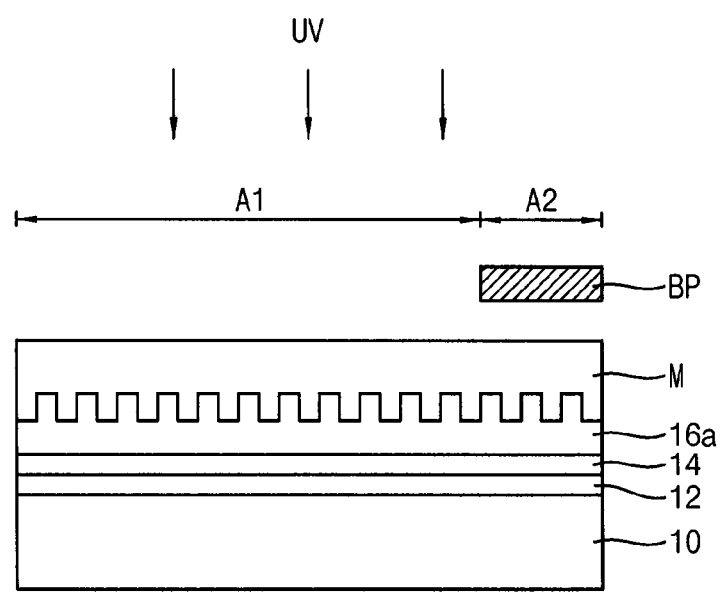

Referring to FIG. 9E, first area A1 is an area on which polymer layer 16a including a plurality of linear patterns is formed. Second area A2 is an area on which a plurality of linear patterns 16a of the polymer layer is not formed.

Light blocking mask BP is disposed in second area A2. Light blocking mask BP may block both heat energy and photo energy. Thus, a portion of polymer layer 16a in second area A2 on which light blocking mask BP is disposed is not cured.

Figure 9F:
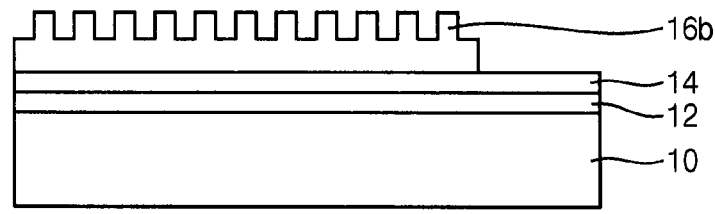

Referring to FIG. 9F, mold M is removed from patterned polymer layer 16a. A portion of polymer layer 16a in second area A2 on which light blocking mask BP and mold M are removed together. A portion of polymer layer 16a in first area A1 on which light blocking mask BM is not formed remains, and polymer pattern 16b is formed.

Figure 9G:
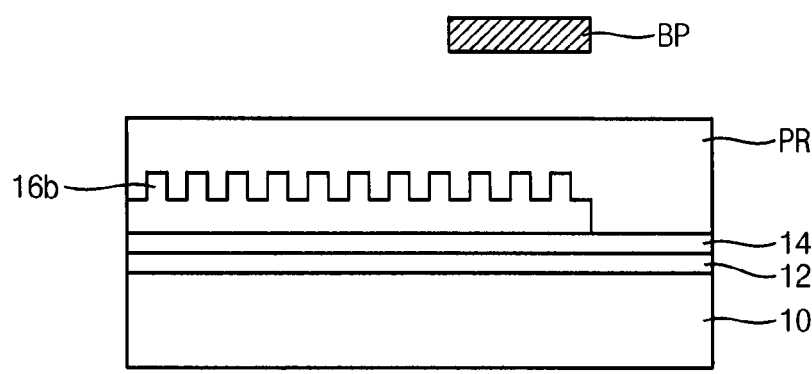

Referring to FIG. 9G, photo resist PR is formed on polymer pattern 16b. A photo resist composition is deposited, exposed using a half-tone mask, and developed to form photo resist PR.

Figure 9H:
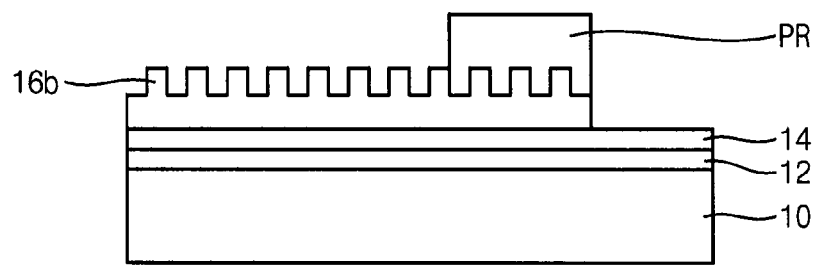

Referring to FIG. 9H, a portion of photo resist PR is removed by an ashing process.

Figure 9I:
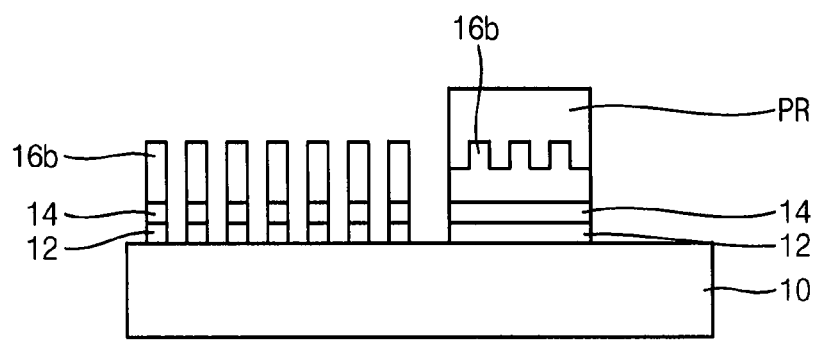

Referring to FIG. 9I, polymer pattern 16b, hard mask 14 and metal layer 12 are etched by using the remaining photo resist PR as a cover mask. In exemplary embodiments, polymer pattern 16b, hard mask 14 and metal layer 12 may be dry-etched.

Figure 9J:
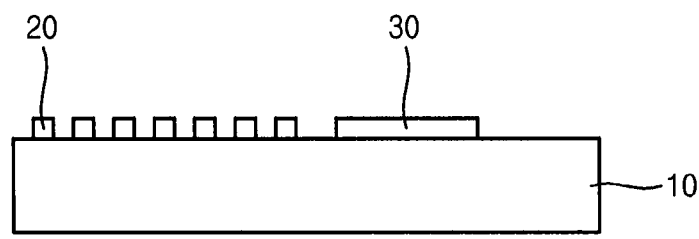

Referring to FIG. 9J, remaining polymer pattern 16b, remaining hard mask 14 and remaining photo resist PR are removed. A plurality of linear pattern 20 and reflection pattern 30 are formed from the remaining metal layer 12. The size of the linear patterns 20 and the reflection pattern 30 may be adjusted by controlling the thickness of metal layer 12 and the width of mold M.

A polarizer includes substrate 10, a plurality of the linear patterns 20 and reflection pattern 30. The reflection pattern 30 and the linear pattern 20 are disposed on a same layer.

Substrate 10 includes material which has relatively high optical transmittance, thermal stability, and chemical compatibility. In exemplary embodiments, substrate 10 may include at least one material selected from the group consisting of glass, polyethylenenaphthalate, polyethylene terephthalate, and polyacryl.

The linear patterns 20 may include at least one material selected from the group consisting of aluminum (Al), gold (Au), silver (Ag), copper (Cu), chrome (Cr), iron (Fe), and nickel (Ni).

Each of the linear patterns 20 may have a line width. Two adjacent linear patterns may be spaced apart from each other by a separation distance. Pitch P is the sum of the line width and the separation distance. The polarizer may include an air gap between adjacent linear patterns 20. In exemplary embodiments, pitch P may be about 50 nm to about 150 nm.

The plurality of the linear patterns 20 are formed in a portion on which light is transmitted. Reflection pattern 30 is formed in a portion on which light is not transmitted.

Reflection pattern 30 and the linear patterns 20 are disposed on the same layer. Reflection pattern 30 may include at least one material selected from the group consisting of aluminum (Al), gold (Au), silver (Ag), copper (Cu), chrome (Cr), iron (Fe), and nickel (Ni).

According to one or more exemplary embodiments, a polarizer is disposed on an opening area of display panel, thus the display panel serves as a transparent display.

According to one or more exemplary embodiments, the polarizer is disposed on an opening area of the display panel, thus optical transmittance of the display panel may be improved.

According to one or more exemplary embodiments, the polarizer is disposed on an opening area of display panel, thus the display panel may serve as a mirror.

According to one or more exemplary embodiments, the polarizer is disposed on a light blocking area of display panel, thus the polarizer may serve as a black matrix and a reflection pattern.

According to one or more exemplary embodiments, the light blocking pattern includes organic material, thus the reflection ratio of the display panel may be reduced.

According to one or more exemplary embodiments, the light blocking pattern and polarizer are formed on the same layer, thus the thickness of the display panel may be reduced.

According to one or more exemplary embodiments, the plurality of linear patterns and the reflection pattern of the polarizer are formed on the same layer. Because the linear patterns and the reflection pattern of the polarizer are formed at the same time, additional processes for forming the reflection pattern process is unnecessary and additional cost may be decreased.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A display panel, comprising:
    a first display substrate comprising a light blocking pattern disposed on a first base substrate and a plurality of opening areas being defined based on the light blocking pattern;

a first polarizer comprising a plurality of first linear patterns spaced apart from each other;
a second display substrate opposite to the first display substrate, the second display substrate comprising a switching device disposed on a second base substrate; and
a second polarizer comprising a plurality of second linear patterns spaced apart from each other and overlapping the first polarizer, wherein:
the plurality of opening areas comprise a color area configured to transmit color light and a white area configured to transmit white light; and
the first polarizer and the second polarizer overlap the color area and the white area.

2. The display panel of claim 1, wherein:
the color area comprises a color filter configured to transmit red light, green light, and blue light; and
the color filter is not formed in the white area.

3. The display panel of claim 1, wherein:
the first polarizer and the second polarizer comprise at least one material selected from the group consisting of aluminum (Al), gold (Au), silver (Ag), copper (Cu), chrome (Cr), iron (Fe), and nickel (Ni).

4. The display panel of claim 1, wherein the light blocking pattern comprises a black coloring agent and organic material.

5. The display panel of claim 1, wherein the first polarizer and the second polarizer are not disposed on an area on which the light blocking pattern is disposed.

6. The display panel of claim 1, wherein:
the light blocking pattern comprises a reflection pattern comprising metal; and
the reflection pattern and the first polarizer are disposed on a same layer.

7. The display panel of claim 6, wherein the reflection pattern overlaps the switching device.

8. The display panel of claim 7, wherein the reflection pattern comprises at least one material selected from the group consisting of aluminum (Al), gold (Au), silver (Ag), copper (Cu), chrome (Cr), iron (Fe), and nickel (Ni).

9. The display panel of claim 1, further comprising a column spacer disposed on the light blocking pattern.

* * * * *